United States Patent [19]

Hofhine

[11] Patent Number: 5,778,238
[45] Date of Patent: Jul. 7, 1998

[54] POWER-DOWN RESET CIRCUIT

[75] Inventor: Paul H. Hofhine, Mesa, Ariz.

[73] Assignee: Microchip Technology Incorporated, Chandler, Ariz.

[21] Appl. No.: 665,905

[22] Filed: Jun. 19, 1996

[51] Int. Cl.$^6$ .................................................. G06F 1/30
[52] U.S. Cl. .................................. 395/750.08; 327/143
[58] Field of Search ........................... 395/750, 750.01, 395/750.07, 750.08; 327/142, 143

[56] References Cited

U.S. PATENT DOCUMENTS

| | | |
|---|---|---|
| 5,243,233 | 9/1993 | Cliff . |
| 5,446,404 | 8/1995 | Badyal et al. ........................ 327/143 |
| 5,485,111 | 1/1996 | Tanimoto ............................. 327/143 |
| 5,570,050 | 10/1996 | Conary ................................ 327/143 |
| 5,578,951 | 11/1996 | Lee et al. ............................ 327/143 |
| 5,587,866 | 12/1996 | Yach et al. .......................... 361/90 |

*Primary Examiner*—Glenn A. Auve
*Attorney, Agent, or Firm*—Wigman, Cohen, Leitner & Myers P.C.

[57] ABSTRACT

A microcontroller operates in response to application of a power supply voltage within a predetermined range of values between upper and lower limits. A power-on reset (POR) circuit generates an output pulse upon initial application of the power supply voltage within that range of values after a predetermined period of time without power. In response to a reduction of power supply voltage to a value below the lower limit at the microcontroller for a sustained interval of time greater than the predetermined period of time, a reset pulse is generated to interrupt operation of the microcontroller. In response to restoration of the power supply voltage to the microcontroller to a value above said lower limit, another reset pulse is initiated to restore operation of the microcontroller. Upon reduction of the power supply voltage to a value below the lower limit for the sustained interval of time, any timing capacitances in the POR circuit are discharged, so that when the power is removed, the POR circuit is initialize to a fully discharged and power off condition, in preparation for generating a reset pulse when the power supply voltage is restored to a value above the lower limit. A time delay is imposed in the response to a reduction of power supply voltage to a value below the lower limit at the microcontroller for a sustained interval of time less than the predetermined period of time.

6 Claims, 3 Drawing Sheets

POWER-DOWN RESET CIRCUIT

CROSS-REFERENCE TO RELATED APPLICATION

This application is related to application Ser. No. 08/508,332, filed Jul. 27, 1995, titled "Power-On-Reset Circuit", now U.S. Pat. No. 5,587,866 issued Dec. 24, 1996 (the "'866 patent), which is assigned to the assignee of the present application.

BACKGROUND OF THE INVENTION

The present invention relates generally to microcontroller devices, and more particularly to circuits for resetting an electronic device, such as a microcontroller, when the supply voltage is interrupted or undergoes a substantial variation, if the interruption or variation exceeds a predetermined interval of time.

Every electronic circuit requires a power supply with a prescribed operating voltage range for proper operation. A microcontroller circuit, for example, may require a nominal 5 volt power supply and a voltage operating range of from 4.5 volts to 5.5 volts. If the power supply voltage falls below 4.5 volts, the device may not function properly, and if the power supply voltage rises above 5.5 volts, the device may suffer irreversible damage.

In complex electronic circuits, such as microprocessors and microcontrollers, a reset signal is typically used to hold the circuit in a reset state until the power supply voltage exceeds a predetermined threshold level. Generally, if the supply voltage falls below this threshold, the circuit is returned to the reset state. Failure to reset the circuit when the power supply voltage is inadequate (i.e., below the threshold level) can produce serious problems. For example, when used in an anti-lock braking system, a low supply voltage may cause the microcontroller to operate improperly, and the braking system to fail. Accordingly, it is extremely important that the reset condition be removed and the electronic circuit allowed to operate only when the power supply voltage exceeds the preset threshold (and when the upper limit of the range of operating voltage is not exceeded). If taken out of reset, the electronic circuit should be returned to that state if the supply voltage later falls below the threshold level.

One advanced scheme for holding an electronic circuit in a reset state upon initialization of power (i.e., power-on) to the circuit is to employ a separate but related circuit to generate power-on reset signals when the power supply exceeds a fixed DC trip point threshold. Such circuits typically include a comparator having one of its inputs coupled to receive a band gap voltage and the other input coupled to receive a scaled version of the power supply voltage, via a resistor divider circuit, such that when the scaled version of the power supply voltage exceeds the band gap voltage, the comparator trips and allows the electronic circuit to be taken out of reset. However, such an implementation requires substantial circuitry with its complexity and added cost, and generally requires that the DC trip point threshold be set at an artificially high voltage. Additionally, the DC trip point threshold is difficult to pinpoint because of normal manufacturing variances of the circuit components, which can cause offset errors in the comparator.

The invention disclosed in the (the "'866 patent) provides a power-on reset (POR) circuit for resetting related electronic circuitry when a trip point generator representative of a component which has been selected as the "worst case component" within the electronic circuitry to be protected, in that this component requires the highest supply voltage level for proper operation, is detected to be operative. The rationale is that if the worst case component is operating properly, reasonably assurance is present that all other components of the electronic circuitry to be protected are also operating properly at the selected level of the power supply voltage. Additionally, since the trip point generator of the POR circuit includes the worst case component of the electronic circuitry, the threshold voltage of the trip point generator adequately tracks power supply level required for operation of the electronic circuitry over normal process and temperature variations. Thus, process or temperature variations which cause changes in the power supply voltage threshold for proper operation of the worst case component will result in corresponding changes in the trip point threshold voltage.

Designation of the worst case component may be a relatively easy task, such as where the electronic circuitry to be monitored and protected is an electrically programmable read-only-memory (EPROM). In that instance, the worst case component is readily chosen to be an EPROM transistor, because transistors used in EPROM memory cells require a threshold voltage substantially higher than other transistors of the device. In other instances, selection of the worst case component may be considerably more difficult, and, to ease the task, two or more components may be designated to set the threshold voltage. This is a sufficiently high power supply voltage to enable those components, and hence, all of the circuit's components, to be operative before allowing the electronic circuitry to be taken out of reset.

A noise filter utilized in the POR circuit places the electronic circuitry back into reset if the power supply voltage falls below a predetermined threshold for at least a predetermined minimum period of time. In this way, the electronic circuitry is put back into the reset state in response to transient variations in the supply voltage that are outside the worst case device voltage range and of sufficient length to cause a device malfunction. However, very short voltage supply fluctuations that are not likely to cause device failure are ignored.

Many microcontrollers and other process or control function devices utilize POR circuits. Some of these devices use EPROM cells and are suitable for non-low voltage products. Other devices use resistive loads and timing capacitors, and tend to be more prone to inability of the POR circuitry to respond properly if $V_{DD}$ is interrupted, whether intentionally or otherwise, and is restored within a time interval (e.g., up to one minute) of insufficient length to cause a reset. In those cases, the circuitry of the present invention provides a considerably better "black-out" response, and thus more robust operation. That is, the circuit of the invention has advantages that include substantially immediate recovery from a power-down condition, absence of DC current drain, and virtual immunity to EMI or noise.

SUMMARY OF THE INVENTION

The present invention is implemented to assure that after power is removed from the microcontroller or other device, even if the power was interrupted for only an instant, and is thereafter restored, a reset pulse will be generated. The invention is employed together with a POR circuit which generates an output pulse upon initial application of power (power-on) if power had not previously been applied to the circuit for a predetermined, relatively long (e.g., a minute) period of time. The circuit of the present invention senses the removal of power and thereupon fully discharges all of the critical capacitances of the POR circuit, so as to ensure that when power is removed, the POR circuit is initialized to a fully discharged and power off condition, in preparation for generating a reset pulse when power is restored. The capacitances are critical, not in the sense of their capacitance values, but rather, in the existence of a residual charge which would otherwise interfere with proper operation of the POR circuit.

The circuit of the invention includes energy storage means so that energy may be available for operation of a low voltage level detector after the power is removed or undergoing below-threshold variations, and discharge means for using the stored energy to discharge the capacitances in the POR circuit, as well as means for rendering the circuit substantially immune to noise on the power supply line, whether of the electromagnetic interference (EMI) type or otherwise.

Advantages of the circuit of the present invention include immediate recovery from a power-down condition, an absence of DC current drain, and high immunity to noise. The invention is characterized by rapid response time, capable of detecting power loss conditions of only a few microseconds, non-power consuming after the power supply has stabilized, and capability to remain active even after the microcontroller is in the sleep state, together with filtering of EMI effects.

BRIEF DESCRIPTION OF THE DRAWINGS

The above and still further objects, features, aspects and attendant advantages of the present invention will become apparent from a consideration of the following detailed description of the presently contemplated best mode of practicing the invention, by reference to a preferred embodiment and method thereof, taken in conjunction with the accompanying drawings, in which.

DETAILED DESCRIPTION OF THE PREFERRED EMBODIMENT AND METHOD OF THE INVENTION

Figure 1:
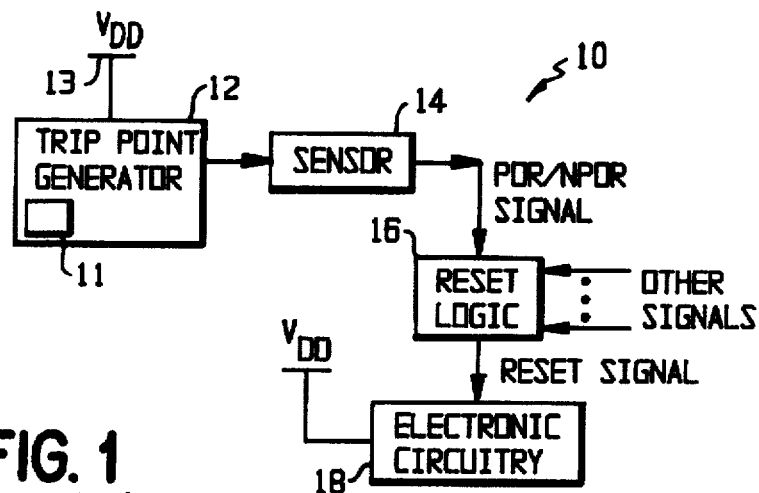
FIG. 1 is a simplified block diagram of a prior art POR circuit as disclosed in (the '"866 patent)

The present invention is preferably used in conjunction with a power-on reset (POR) circuit of the type described in (the '" 866 patent), which is incorporated herein by reference in its entirety, although portions of that application are reproduced herein for the sake of convenience to the reader. In FIG. 1, a trip point generator 12 is coupled to a terminal 13 for application of power supply operating voltage $V_{DD}$. The trip point generator includes worst case component 11 derived from electronic circuitry 18. The latter is monitored by sensor 14 to detect when the worst case component is operative, and, if it is, a logic signal is generated to that effect, thereby assuring that all other devices within the electronic circuitry are also operative. The worst case component 11 may, for example, be an actual isolated component within the electronic circuitry, to conserve size and power of the combined POR circuit and the electronic circuitry, or it may be a duplicate/replica of the worst case component.

When sensor 14 detects that worst case component 11 is operative, it generates a pulse on the POR signal, or, alternatively, on the complement of the POR signal (i.e., on a not POR signal, or signal NPOR). In either case, the pulse is applied to the electronic circuitry 18 via reset logic 16, which enables the electronic circuitry to be taken out of reset in recognition that the operating voltage has achieved a predetermined threshold level that allows the worst case component to become operative.

The reset logic 16 may be responsive to other signals, such as from an external pin, a watch dog timer or an interrupt, as well as to the POR signal which, when applied to the electronic circuitry 18, holds the latter in reset. Whenever the POR signal is a logic high (or equivalently, signal NPOR is a logic low), the electronic circuitry 18 is to be held in a reset condition. The active reset signal from reset logic 16 serves that purpose.

By including the worst case component 11 of electronic circuitry 18, the trip point generator has a threshold voltage that tracks the electronic circuitry over normal process and temperature variations to provide an optimum threshold for removal from reset and for maximum power supply operating range of the electronic circuitry 18. Process or temperature variations that cause a change in the power supply voltage threshold required for proper operation of worst case component 11, cause corresponding changes in the trip point threshold voltage. In these circumstances, the electronic circuitry 18 will not be taken out of reset until worst case component 11 is undergoing proper operation. Thus, the POR circuit of the '332 application provides the optimum voltage range for electronic circuitry 18 and assures that the latter circuitry will not be removed from reset before the supply voltage exceeds a threshold within the proper operating voltage range for all devices within electronic circuitry 18 despite variations of process and temperature. The POR circuit provides a reset signal, then, solely as a function of when the worst case component becomes operative, independent of the ramp rate of the power supply, and without need for special timers or the like. A timing capacitor is present in the conventional POR circuit, which is used to assure the generation of a good reset pulse in the case of a very fast-rising $V_{DD}$. It is this timing capacitor that creates a substantial part of the problem addressed by the present invention.

Figure 2:
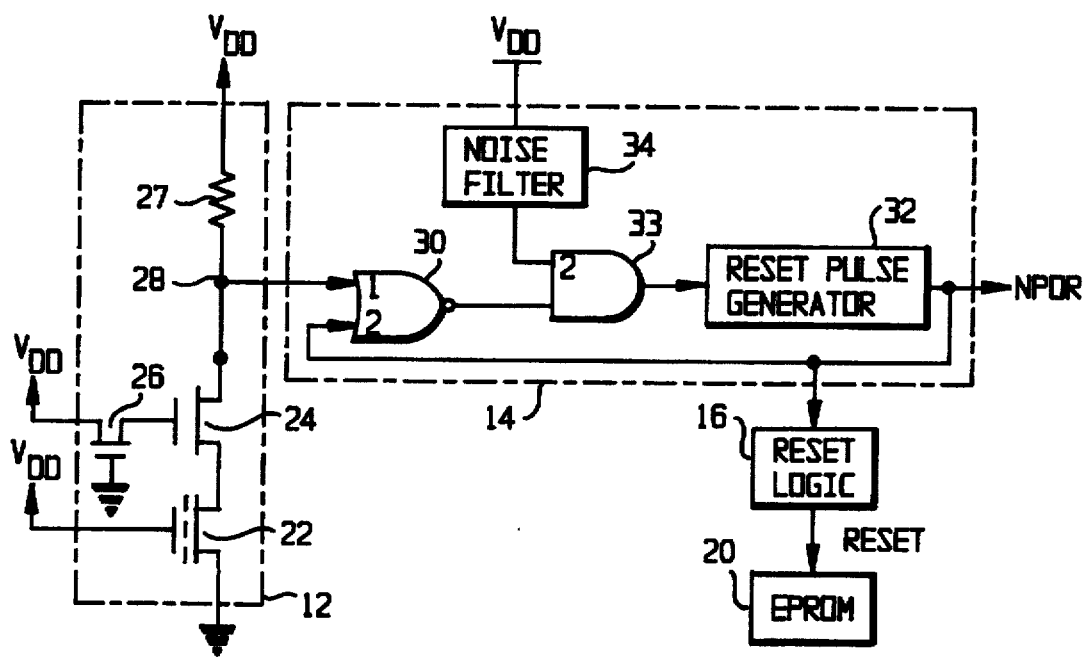
FIG. 2 is a more detailed schematic and block diagram of the prior art POR circuit of FIG. 1.

In the more detailed schematic/block diagram of FIG. 2, the prior art trip point generator 12 includes an EPROM cell transistor 22 which generates the trip point threshold voltage used for resetting EPROM 20. In this example, because the electronic circuitry to be monitored is an EPROM 20, EPROM transistor 22 is conveniently selected as the worst case component since the transistors used in the EPROM memory cells have a threshold voltage which is substantially higher than the threshold for other transistors used in the device. Accordingly, when EPROM memory cell transistor 22 becomes operative, it tends to assure that all of the transistors and other components within EPROM 20 are also operative.

EPROM transistor 22 has a control/gate electrode coupled for application of power supply voltage $V_{DD}$, and a source electrode coupled to electrical ground. The trip point generator 12 also includes transistors 24 and 26 and a resistor 28. Transistor 24 has a source electrode coupled to the drain electrode of transistor 22, a drain electrode coupled to a circuit node 28, and a gate electrode coupled through the source-drain path of transistor 26 for connection to the terminal for power supply voltage $V_{DD}$. The gate electrode of transistor 26 is returned to ground. Circuit node 28 is also coupled through resistor 27 to the terminal for application of power supply voltage $V_{DD}$ to the circuit.

Assuming that all other conditions set by reset logic 16 are satisfied, sensor 14 detects when EPROM transistor 22 becomes operative, and, in response, generates a pulse to take EPROM 20 out of reset. The sensor includes a NOR gate 30, an AND gate 33, a reset pulse generator 32, and a noise filter 34. NOR gate 30 has a first input coupled to circuit node 28, a second input coupled to the output of reset generator 32, and an output coupled to a first input of AND gate 33. The output of the latter is applied to an input of reset generator 32. The second input of AND gate 33 is coupled to an output of noise filter 34 whose input is coupled to the terminal for supply voltage $V_{DD}$. The output of reset pulse generator 32 supplies not power-on reset signal (NPOR) to EPROM 20 via logic 16. Signal NPOR is a logic low when worst case component EPROM transistor 22 is non-operative, thereby holding EPROM 20 in a reset condition, and is a logic high when transistor 22 is operative, thereby allowing EPROM 20 to be taken out of reset.

In operation of the circuit of FIG. 2, upon voltage power-on, reset pulse generator 32 initially provides a logic low output, to place signal NPOR at a logic low ("0") level and to hold EPROM 20 in a reset condition. Accordingly, the second input of NOR gate 30 is at a logic "0". Further, the voltage at circuit node 28 is substantially equal to voltage $V_{DD}$, so that a logic "1" is applied to the first input of NOR gate 30. In response, the latter gate applies a logic "0" to the first input of AND gate 33. Also upon power-on, noise filter 34 is initialized to apply a logic "1" to the second input of NOR gate 33. Accordingly, AND gate 33 applies a logic "0" to the input of reset pulse generator 32 to hold the output of the latter at a logic low and force the electronic circuitry to be monitored. In this example, the result of this monitoring is that EPROM 20 will remain in a reset condition.

When voltage $V_{DD}$ rises above the threshold voltage to enable EPROM transistor 22 to become operative, current is allowed to flow through transistor 22 as well as transistor 24 and resistor 27, and the voltage appearing at circuit node 28 decreases to a level representative of a logic low. This forces NOR gate 30 to provide a logic "1" at its output which propagates through AND gate 33 to provide a logic "1" at the input of reset pulse generator 32. In response, reset pulse generator 32 causes signal NPOR to be at a logic high voltage level thereby allowing EPROM 20 to be taken out of reset since EPROM transistor 22 is now operative. Moreover, since trip point generator 12 includes the worst case transistor 22 within EPROM 20, when that transistor becomes operative, it is assured that all other transistors and components within EPROM 20 are also operative.

If at any time thereafter voltage $V_{DD}$ falls below the threshold level, EPROM transistor 22 will be turned off and the voltage appearing at circuit node 28 will again be at a logic high. In response, NOR gate 30 provides a logic "0" at the first input of NOR gate 33 which thus provides a logic low at the input of reset pulse generator 32. This causes the output of the reset generator to go low again, and to return EPROM 20 to a reset state.

Mid-frequency variations, i.e., in a range near 1 megahertz (MHz), may occur on voltage $V_{DD}$ with the result of a low voltage level for a period which is insufficient to turn off transistor 22, and which may also cause the failure of EPROM 20. Also, high frequency variations, i.e., above 10 MEW attributable to such things as electromagnetic coupling (EMC), may occur on voltage $V_{DD}$ with the result of improper operation as a consequence of either an improper reset of or an improper failure to reset EPROM 20. To preclude such a result, noise filter 34 monitors the power supply voltage after power-on to determine if the supply is below the threshold level determined by the worst case device for a period of time sufficient to damage EPROM 20, but possibly insufficient to turn transistor 22 off. If the power supply voltage falls below the predetermined threshold level for a predetermined interval of time sufficient to allow discharge of a capacitor, a logic "0" is produced at the output of the noise filter to provide a logic "0" at the input of reset pulse generator 32. This causes the generator to assert signal NPOR and reset EPROM 20.

As pointed out earlier herein, for some electronic circuits, it may not be as easy to select the worst case component that requires the highest operating supply voltage to function properly, as it was in the above example. In such instances, two or more components may be designated to determine the threshold voltage to be reached by the power supply voltage before those selected two or more components will become operative, and thus, before the electronic circuitry to be monitored is allowed to be taken out of reset.

Figure 3:
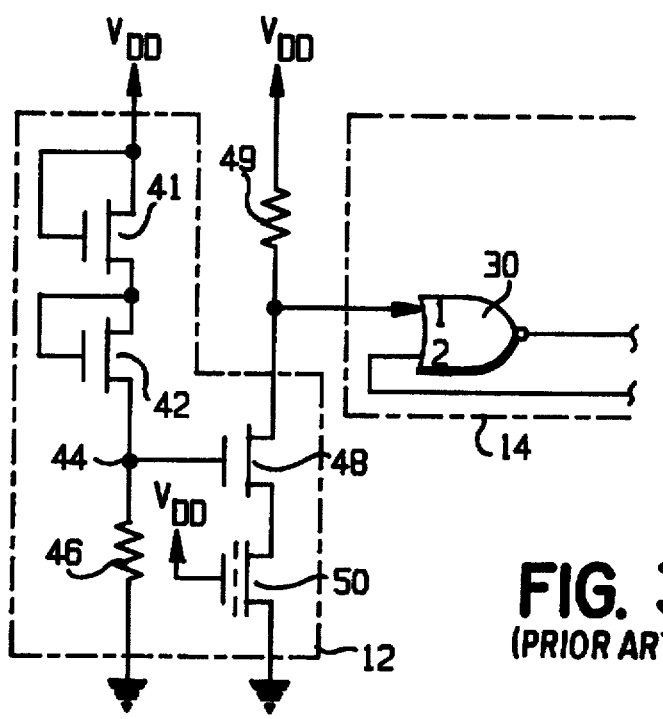
FIG. 3 is a schematic diagram of a prior art alternative form of trip generator circuit also disclosed in the '332 application.

FIG. 3 includes another form of prior art trip point generator 12, disclosed in the '332 application, which has serially-coupled transistors 41 and 42 coupled between a supply voltage terminal for $V_{DD}$ and circuit node 44. Transistor 41 is configured to operate as a diode, with its drain and gate electrodes coupled to receive supply voltage $V_{DD}$, and its source electrode coupled to the drain and gate electrodes of diode-configured transistor 42. The latter has its source electrode coupled to circuit node 44 which is returned to ground through resistor 46. Node 44 is also coupled to the gate electrode of transistor 48 which has a drain electrode coupled to the first input of NOR gate 30 and through resistor 49 to a terminal for supply voltage $V_{DD}$. The source electrode of transistor 48 is coupled to the drain electrode of transistor 50 which has its source electrode connected to ground and its gate electrode coupled for application of supply voltage $V_{DD}$.

In operation of the circuit of FIG. 3, when the level of $V_{DD}$ is sufficient to render both transistors 41 and 42 operative, current flows through both transistors thereby causing the voltage at node 44 to increase to a level sufficient to turn on transistor 48. This causes the voltage at the first input of NOR gate 30 to be pulled down to a logic "0" via transistor 50. Consequently, when transistors 41 and 42 are operative, the voltage at the first input of NOR gate 30 is a logic low. In this way, the serial coupling together of transistors 41 and 42 allows them to act jointly as the worse case component of the electronic circuitry to be monitored, to designate the threshold voltage level that determines when the electronic circuitry is to be taken out of reset. Both of these transistors must be operative before the electronic circuitry is allowed to come out of reset.

Figure 4:
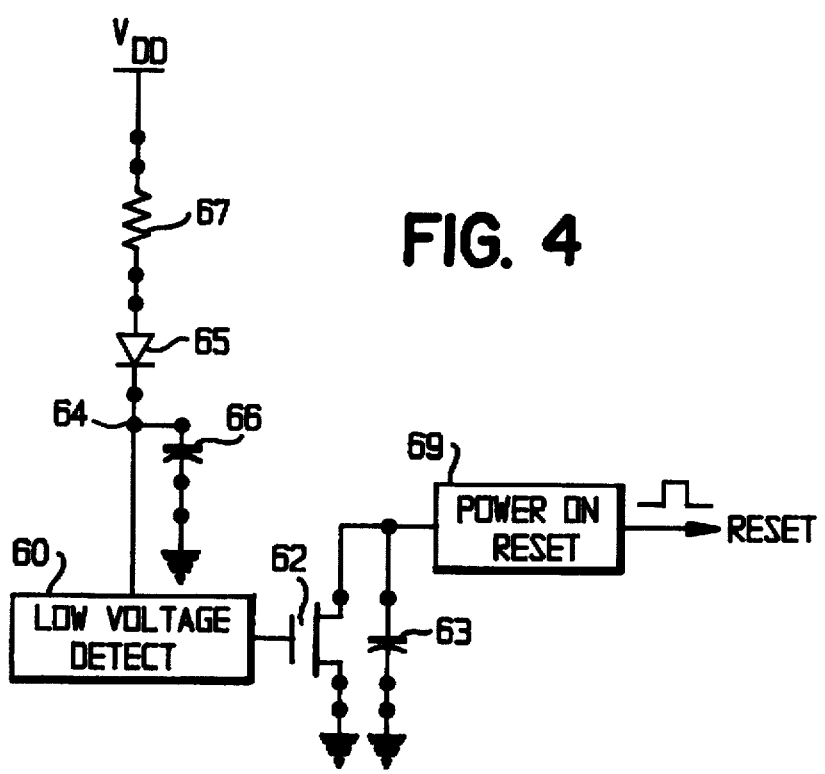
FIG. 4 is a simplified block diagram illustrating a power-down reset circuit in accordance with the present invention, including low voltage detector and POR circuit and a simplified energy storing circuit that enables the low voltage detector to remain operative in the absence of power supply.

Referring now to the block diagram of FIG. 4, a presently preferred embodiment of the power-down reset circuitry of the present invention includes a low voltage detect circuit or low voltage detector 60; a POR circuit 69; a device such as a MOSFET transistor 62 for discharging a delay capacitor 63; a diode 65 and capacitor 66 to store energy for operation of the low voltage detect circuit when power is removed; and a resistor 67 to aid in isolating the circuit from the effects of noise including EMI. The power-down reset circuitry is implemented to have a fast response time to enable detection of power outage conditions on the order of only a few microseconds, to consume little or no power once the power supply has been restored and stabilizes, and to remain active even when the microcontroller is in sleep state or sleep mode.

An initial application of power to POR circuit 69 causes capacitor 63 to discharge, and the POR circuit generates a reset pulse. At the end of this reset pulse, capacitor 63 is charged to the applied (power supply) voltage, and capacitor 66 is charged through diode 65 to a value close to the applied voltage (i.e., displaced only by the value of the drops across resistor 67 and diode 65, both of which are relatively small). Low voltage detector 60 senses a drop in supply voltage to a value below a predetermined threshold value, as would occur if the power supply $V_{DD}$ were interrupted. Then, following a brief delay, circuit 60 applies the voltage across capacitor 66 to the gate electrode of transistor 91. This causes the transistor to switch to a low impedance, and thereby discharges capacitor 63. This operation prepares POR circuit 69 for the task of responding to a restoration of power supply $V_{DD}$ to the overall circuit. The energy stored in capacitor 66 is adequate to power the low voltage detect circuit 60 for a period of time sufficient to allow capacitor 63 to be fully discharged.

Resistor 67, together with the capacitance distributed on node 64, acts as an RC filter to isolate POR circuit 69 from noise on the power supply. The RC combination is preferably adjusted to provide a 1 Megahertz Mhz), or approximately so, roll-off frequency. The capacitance C in the RC filter of approximately $10^{-11}$ at this value, is primarily composed of the diffusion capacitance of the N-well into which all P-channel devices are fabricated, in the semiconductor (e.g., silicon) substrate of the device, plus any other small distributed capacitance in that part of the circuit.

Figure 5:
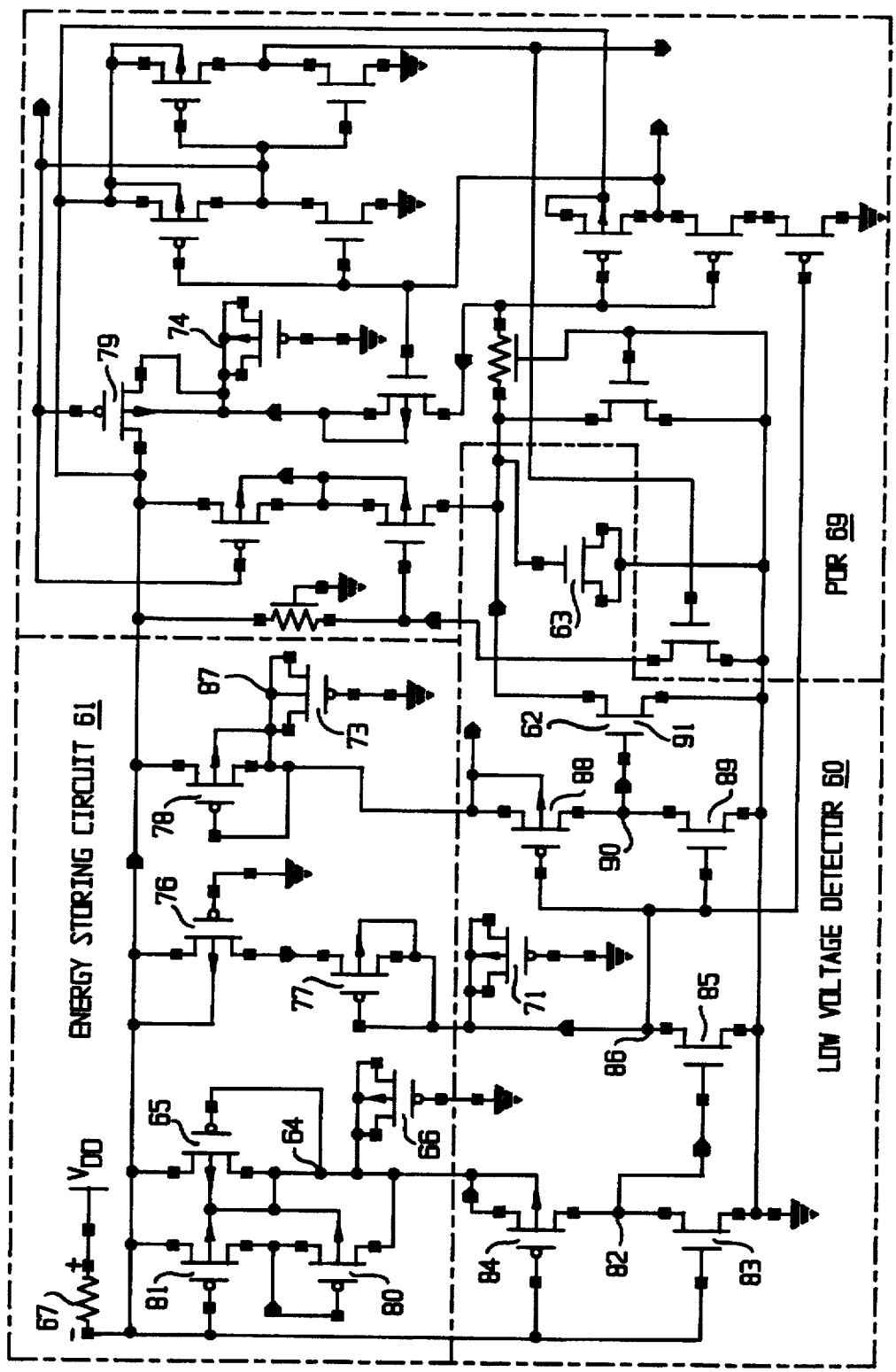
FIG. 5 is a more detailed schematic diagram illustrating the power-down reset circuit and POR circuit of FIG. 4.

In the more detailed schematic diagram of FIG. 5, the same or like reference numbers to those of FIG. 4 are used for corresponding components. The power supply voltage $V_{DD}$ is applied to POR circuit 69, which is peripheral to a microcontroller, for example, as well as the low voltage detector 60, and the energy storing circuit 61. When supply voltage $V_{DD}$ is effectively removed from the circuit, by unintended or intended interruption, supply line variations, or otherwise, energy remains stored in certain capacitors, such as 66, 71, and 73. These devices are P-channel field-effect transistors (FETs) but, in function, are really capacitances—the inter-electrode capacitances of the respective devices, and are used in the circuit to add capacitance and to store energy. These particular capacitors are selected for the energy storage because each of them presents high capacitance per unit area of the semiconductor chip, with device layout efficiency and concomitant savings in "real estate" (that translates into chip size). This storage of energy by the inter-electrode capacitances is a significant part of the function of the entire power-down reset circuit.

The capacitors are charged to an energy level of $V_{DD}$-$V_t$—that is, the difference between the supply voltage and the threshold voltage of the various MOSFET transistors ($V_t$), by the diode-configured devices 65, 77, and 78 and the corresponding $P_{active}$-to-N-well diodes. In this operation, the supply voltage $V_{DD}$ increases to cause device 78 (typical of 65, 77, and 78) to be turned "on", but the latter device is also by-passed because of the drain-to-well junction, so it becomes analogous to a diode. And as the drain tracks the increase in $V_{DD}$, the P-channel threshold will rise above node 87. When this voltage difference between $V_{DD}$ and node 87 is greater than the threshold voltage of device 78, the latter will turn on and charge node 87 with it. And the level to which node 87 is charged will store itself on device 73. Thus, device 73 is an active contributor to the operation, and also serves as a diode. When $V_{DD}$ goes down, device 78 turns off, and the charge remains trapped on node 87.

Referring now to the energy storing portion 61 of the circuit, including devices 80 and 81 and the surrounding circuitry, as $V_{DD}$ increases through device 65, node 64 will charge essentially a diode drop behind $V_{DD}$. If $V_{DD}$ is nominally 5 volts, for example, node 64 will charge up to about 4.5 v. If $V_{DD}$ now takes a sudden negative drop, to $V_{DD}/2$—roughly 2 to 2.5 volts, for example,—it will turn on the inverter formed by devices 83 and 84, thereby triggering the initiation of a reset pulse. That is, device 84 will be turned "on" and device 83 will be turned "off", which allows node 82 to start rising above ground level. And the pulse formed there (i.e., the reset pulse) will propagate down a chain of inverters, ultimately tripping the POR circuit. It is undesirable for this set of events to occur, except at a relatively low level of $V_{DD}$.

To correct this, devices 80 and 81—which are diode-configured—operate such that when $V_{DD}$ goes below the voltage on node 64, it will start to discharge node 64. This operation lags behind, and node 64 will always be the value of $V_{DD}$ plus approximately two P-channel threshold drops—roughly, from about 1.5 to 2 volts. As node 64 drops, the switching point of 83 and 84 drops with it, to a point at which, when $V_{DD}$ has dropped to about 1.5 volts, will begin to switch the inverter, and the change on the output of the inverter formed by 83 and 84 will propagate to the gate of device 91, discharging the capacitor 63.

Thus, in operation, devices 80 and 81 are adapted to discharge capacitor 66 as the level of $V_{DD}$ falls. This discharge lags the drop in $V_{DD}$ by about 2 Vt, and stops at a level of about 2 Vt. This prevents the voltage at node 82 from going positive until $V_{DD}$ drops to a sufficiently low level—approximately Vt—to turn off transistor 83. When $V_{DD}$ drops below this level, transistor 83 remains inactive and transistor 84 is turned on, which pulls node 82 to the voltage stored in capacitor 70, i.e., to a logic "1" level.

In the next stage of the low voltage detector 60, device 85 is a discharge device for capacitor 71. Node 86 is normally charged high, and to generate a reset it is necessary to pull that node to ground. When node 82 goes high, transistor 85 is turned on, node 86 goes to ground, and capacitance 71 is thereby discharged to ground. As node 86 goes low, device 88 of the inverter it forms with device 89 is turned on, which pulls node 90 high, up to the level of the voltage on capacitor 73. It is not particularly important whether the voltage on capacitor 73 remains at a higher voltage or not, and hence, it need not track $V_{DD}$ downward. When node 90 goes high, it turns on device 62, which discharges capacitor 63 (the POR circuit timing capacitor) to ground through the source-drain path of now-conductive device 62. This makes the POR circuit appear as though it has not had voltage $V_{DD}$ applied to it. Hence, the POR circuit is reset and ready to pick up another rise in $V_{DD}$ and produce another valid POR output. That is, with capacitor 63 discharged, the POR circuit will generate a valid POR reset pulse when the power supply voltage $V_{DD}$ again goes high—i.e., when the supply voltage exceeds the predetermined threshold.

The POR circuit 69 function is performed by the components shown within the dotted portion 69 of FIG. 5. That portion is substantially entirely conventional and corresponds the Power on Reset circuit 69 of FIG. 4. The Low Voltage Detector is performed by circuit portion 60 of FIG. 5, corresponding to block 60 of FIG. 4. And the energy storing circuitry 61 supplies the power to maintain the low voltage detector operating in the absence of $V_{DD}$.

The pulse at the node between devices 83 and 84 could be supplied directly to the input of device 62, but that would be much less desirable because it produces a virtually immediate response to $V_{DD}$ variations. Instead, in practice according to the invention, the aforementioned node is followed by essentially two inverters, so that their propagation delay time is added as an intentional delay before the $V_{DD}$ variation actually arrives at the POR circuit. This intentional delay is nominally about 2 microseconds. The POR circuit response time is sufficiently fast to enable delivery of a reset pulse in response to power supply interruptions ($V_{DD}$ dropouts) nominally greater than two microseconds. Actual response time is a function of process variations, the power supply voltage, and temperature. Noise immunity is aided by the presence of the small resistor 94 in the power supply line which, together with associated capacitance in the supply line circuit, forms an RC low pass filter designed with about a one microsecond time constant. The time constant of the RC filter slows down the application of any noise pulse coming in on $V_{DD}$, and even if the variation in supply voltage were sufficient to cause a response, the propagation delay imposed by the two inverters is sufficient to preclude too rapid a response by the POR circuit to such a supply variation. Between those two design elements, the circuit provides an enhanced noise immunity to filter out any high frequency components (including EMI) on the supply voltage, above about one Mhz. In other words, the POR circuit is essentially isolated from the power supply line of the main circuit chip and its noise.

Although certain preferred embodiments and methods have been described herein, it will be apparent to those skilled in the art to which the invention pertains from the foregoing description that variations and modifications of the described embodiments and methods may be made without departing from the true spirit and scope of the invention. Accordingly, it is intended that the invention shall be limited only to the extent required by the appended claims and the rules and principles of applicable law.

What is claimed is:

1. In a microcontroller device adapted to perform a control function in response to certain predetermined operating conditions expressed in electrical parameters, including application to the microcontroller device of a power supply voltage within a predetermined range of values between upper and lower limits, an improvement comprising power-on reset (NOR) circuit means for generating an output pulse upon initial application of said power supply voltage within said range of values after a predetermined period of time without power, means responsive to a reduction of power supply voltage to a value below said lower limit at the microcontroller device for a sustained interval of time greater than said predetermined period of time for generating a reset pulse to interrupt operation of the microcontroller device and thereupon discharging any timing capacitances in the POR circuit, so that when power is removed, the POR circuit is initialized to a fully discharged and power off condition, in preparation for generating a reset pulse when the power supply voltage is restored to a value above said lower limit, means responsive to restoration of the power supply voltage to the microcontroller device to a value above said lower limit for initiating a reset pulse to restore operation of the microcontroller device energy storage means for storing energy while the power supply voltage is in said range, and for retaining a store of energy after the power supply voltage falls to a value below said lower limit, to provide a store of available energy despite the absence or inadequacy of external power, and means for using the stored energy to discharge the capacitances in the POR circuit.

2. The improvement of claim 1, further including means responsive to noise within a predetermined frequency range on the power supply voltage for removal of said noise therefrom before application of the power supply voltage to the POR circuit.

3. The improvement of claim 1, further including means for imposing a time delay in response to a reduction of power supply voltage to a value below said lower limit at the microcontroller device for a sustained interval of time less than said predetermined period of time.

4. In a microcontroller device adapted to perform a control function in response to certain predetermined operating conditions expressed in electrical parameters, including application to the microcontroller device of a power supply voltage within a predetermined range of values between upper and lower limits, and having a power-on reset (POR circuit, a device-implemented method comprising the steps of:

generating an output pulse from said POR circuit upon initial application of said power supply voltage within said range of values after a predetermined period of time without power:

in response to a reduction of power supply voltage to a value below said lower limit at the microcontroller device for a sustained interval of time greater than said predetermined period of time, generating a reset pulse to interrupt operation of the microcontroller device, and thereupon discharging any timing capacitances in the POR circuit, so that when power is removed, the POR circuit is initialized to a fully discharged and power off condition, in preparation for generating a reset pulse when the power supply voltage is restored to a value above said lower limit;

in response to restoration of the power supply voltage to the microcontroller device to a value above said lower limit, initiating a reset pulse to restore operation of the microcontroller device storing energy while the power supply voltage is in said range, and retaining a store of energy after the power supply voltage falls to a value below said lower limit, to provide a store of available energy despite an absence or inadequacy of external power, and using the stored energy to discharge timing capacitances in the POR circuit.

5. The device-implemented method of claim 4, further including the steps of:

in response to noise within a predetermined frequency range on the power supply voltage, removing said noise therefrom before application of the power supply voltage to the POR circuit.

6. The device-implemented method of claim 4, further including the steps of:

imposing a time delay in response to a reduction of power supply voltage to a value below said lower limit at the microcontroller device for a sustained interval of time less than said predetermined period of time.

* * * * *